United States Patent
Lee et al.

(10) Patent No.: US 8,455,268 B2
(45) Date of Patent: Jun. 4, 2013

(54) GATE REPLACEMENT WITH TOP OXIDE REGROWTH FOR THE TOP OXIDE IMPROVEMENT

(75) Inventors: Chungho Lee, Sunnyvale, CA (US); Hiroyuki Kinoshita, San Jose, CA (US); Kuo-Tung Chang, Saratoga, CA (US); Rinji Sugino, San Jose, CA (US); Chi Chang, Saratoga, CA (US); Huaqiang Wu, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 872 days.

(21) Appl. No.: 11/848,515

(22) Filed: Aug. 31, 2007

(65) Prior Publication Data
US 2009/0061631 A1   Mar. 5, 2009

(51) Int. Cl.
*H01L 21/00* (2006.01)
*H01L 21/311* (2006.01)

(52) U.S. Cl.
USPC .......... 438/4; 438/479; 438/485; 438/689; 438/696; 438/700; 438/721; 216/39; 216/41; 216/56; 216/83; 216/99

(58) Field of Classification Search
USPC 438/721, 4, 479, 485, 689, 696, 700; 216/39, 216/41, 56, 83, 99
See application file for complete search history.

(56) References Cited

U.S. PATENT DOCUMENTS

| | | | |
|---|---|---|---|
| 6,830,998 B1 * | 12/2004 | Pan et al. | 438/592 |
| 7,078,282 B2 * | 7/2006 | Chau et al. | 438/183 |
| 7,456,068 B2 * | 11/2008 | Kavalieros et al. | 438/301 |
| 7,521,317 B2 * | 4/2009 | Li et al. | 438/257 |
| 2001/0002712 A1 | 6/2001 | Horiguchi et al. | |
| 2003/0008496 A1 * | 1/2003 | Deleonibus | 438/630 |
| 2004/0197977 A1 * | 10/2004 | Deleonibus | 438/202 |
| 2005/0176203 A1 * | 8/2005 | Chang et al. | 438/261 |
| 2007/0048936 A1 * | 3/2007 | Kim et al. | 438/257 |
| 2007/0048957 A1 * | 3/2007 | Lee et al. | 438/324 |
| 2007/0077765 A1 * | 4/2007 | Prince et al. | 438/694 |
| 2007/0173069 A1 * | 7/2007 | Kim | 438/758 |
| 2008/0023750 A1 * | 1/2008 | Xue et al. | 257/321 |
| 2008/0076224 A1 * | 3/2008 | Ryu et al. | 438/287 |
| 2008/0083946 A1 * | 4/2008 | Fang et al. | 257/324 |

FOREIGN PATENT DOCUMENTS

| | | |
|---|---|---|
| FR | 2810157 | 12/2001 |
| JP | 08288412 A * | 11/1996 |

OTHER PUBLICATIONS

International Search Report for PCT/US2008/074292 dated Oct. 6, 2008.
Written Opinion for PCT/US2008/074292 dated Oct. 6, 2008.
Murakawa et al, Spa Plasma for Sub-100NM, Jan. 1, 2003, Solid State Technology, Pennwell Corporation, Tulsa, OK, USA, pp. 59, 60, 62.

* cited by examiner

*Primary Examiner* — Nadine G Norton
*Assistant Examiner* — Christopher Remavege
(74) *Attorney, Agent, or Firm* — Turocy & Watson, LLP

(57) ABSTRACT

Methods of replacing/reforming a top oxide around a charge storage element of a memory cell and methods of improving quality of a top oxide around a charge storage element of a memory cell are provided. The method can involve removing a first poly over a first top oxide from the memory cell; removing the first top oxide from the memory cell; and forming a second top oxide around the charge storage element. The second top oxide can be formed by oxidizing a portion of the charge storage element or by forming a sacrificial layer over the charge storage element and oxidizing the sacrificial layer to a second top oxide.

20 Claims, 12 Drawing Sheets

GATE REPLACEMENT WITH TOP OXIDE REGROWTH FOR THE TOP OXIDE IMPROVEMENT

TECHNICAL FIELD

Described are methods of replacing/reforming a top oxide of a memory cell and/or improving quality of a top oxide of a memory cell.

BACKGROUND

Modern computing devices utilize a variety of kinds of memory devices to store and access information. Memory devices include the general classes of random access memories (RAM) and read only memories (ROM). These classes further contain static RAM (SRAM), dynamic RAM (DRAM), programmable ROM (PROM), electrically programmable ROM (EPROM), electrically erasable PROM (EEPROM), as well as FLASH memory, and the like. Most memory devices employ an internal architecture in the form of an array memory of bit cells, containing plural rows and plural intersecting columns.

A memory cell is placed at each intersecting row and column in the array. Typically, a particular memory cell is accessed by activating its row and then reading or writing the state of its column. Memory sizes are defined by the row and column architecture. For example, a 1024 row by 1024 column memory array defines a memory device having one megabit of memory cells. The array rows are referred to as word lines and the array columns are referred to as bit lines.

In memory cells, single bits of data are stored in and read from respective memory cells. The cells are generally programmed by hot electron injection and erased by Fowler-Nordheim tunneling. The erase, program, and read operations are commonly performed by application of appropriate voltages to certain terminals of the memory cell. In an erase or write operation the voltages are applied so as to cause a charge to be removed or stored in a charge storage layer of the memory cell.

The trend in semiconductor memory devices has been toward higher circuit density with higher numbers of bit cells per device, lower operating voltages, and higher access speeds. To achieve these high densities there have been, and continue to be, efforts toward scaling down device dimensions (e.g., at sub-micron levels). However, as scaling down device dimensions, charges trapped in the charge storage layer may leak through a top oxide layer to a poly gate. Thus, the requirement of small features with close spacing between adjacent features requires sophisticated manufacturing techniques.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides methods of replacing/reforming a top oxide around a charge storage element of a memory cell. Another aspect of the subject invention provides methods of improving quality of a top oxide around a charge storage element of a memory cell. The methods can involve removing a first poly over a first top oxide from the memory cell; removing the first top oxide from the memory cell; and forming a second top oxide around the charge storage element. By replacing/reforming the top oxide around the storage element, the quality of the reformed top oxide can be improved.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
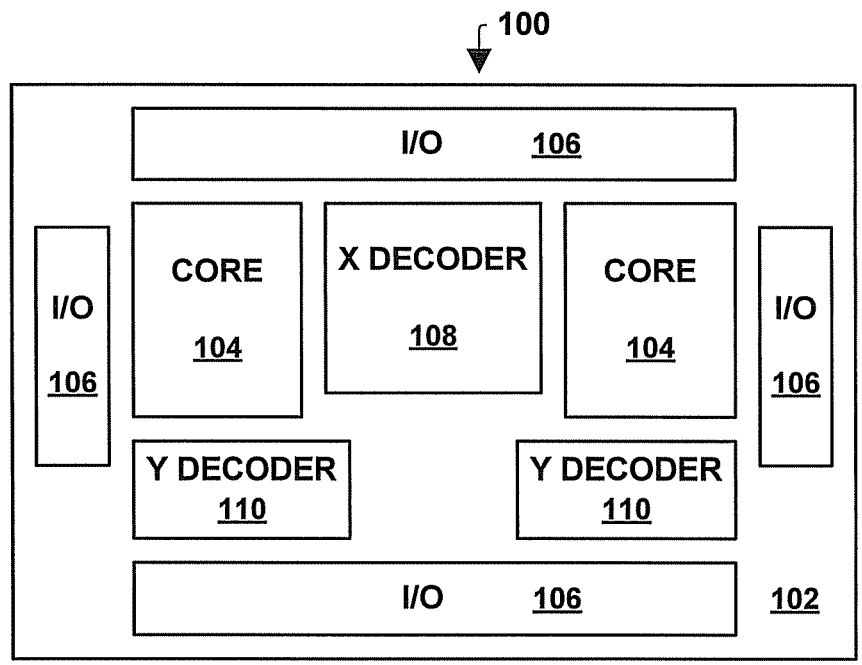
FIG. 1 illustrates a top view of an exemplary flash memory device in accordance with an aspect of the subject invention.

In memory cells, erase, program, and read operations are commonly performed by application of appropriate voltages to certain terminals of the memory cells. In an erase or write operation the voltages are applied so as to cause a charge to be removed or stored in the memory cell. In a read operation, appropriate voltages are applied so as to cause a current to flow in the memory cell, wherein the amount of such current is indicative of the value of the data stored in the cell. A memory device includes appropriate circuitry to sense the resulting cell current in order to determine the data stored therein, which is then provided to data bus terminals of the memory device for access by other devices in a system in which the memory device is employed.

Memory cells may contain a charge storage layer over a semiconductor substrate and a first poly gate around the charge storage layer. The charge storage layer contains a gate oxide, a charge storage element, and a top oxide. The top oxide can function to isolate the transfer of charges between the storage element and the first poly, permitting scaling of the storage element to realize low programming voltages. However, the top oxide may suffer from certain drawbacks as a memory device is scaled down. The lower the quality of the top oxide, the more charge may leak through such a layer. For this reason, the quality of the top oxide is an important feature in a memory device.

The innovation disclosed herein provides methods of replacing/reforming a top oxide around a charge storage layer of a memory cell and/or improving quality of a top oxide of a memory cell. To improve the quality of the top oxide, a first poly and a top oxide can be removed and another top oxide can be reformed in its place. The methods can be performed on the memory devices before finally defining poly word lines by lithography and etching techniques.

One advantage of the methods is improving quality of a top oxide of a memory device by replacing/reforming a top oxide. In one embodiment, by replacing/reforming the top oxide around a charge storage element, the quality of the reformed top oxide can be improved. For example, a high F-N field of the reformed top oxide can be achieved. Charge leakage paths can be reduced and/or minimized at the interface between the top oxide and the charge storage layer. In another embodiment, by replacing/reforming the top oxide around the charge storage element, any suitable height of the reformed top oxide can be achieved. In yet another embodiment, by employing a sacrificial layer for forming a top oxide, the thickness of the resultant top oxide can become thinner. The methods described herein therefore effectively addresses the concerns raised by the trend towards the miniaturization of memory devices.

The top oxide replacement/improvement described herein can be applied to any suitable type of memory cell. For example, the top oxide replacement/improvement described herein can be applied to single-level memory cells, multi-level memory cells, single bit memory cells, dual bit memory cells, quad bit memory cells, and the like. The dual bit memory is a relatively modern memory technology and allows multiple bits to be stored in a single memory cell. The dual bit memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit storage of two bits.

A dual bit memory cell can have a semiconductor substrate with implanted conductive bit lines. A charge storage layer can contain one or more layers and can be formed over the semiconductor substrate. For example, the charge storage layer can contain three separate layers: a first insulating layer, a charge storage dielectric layer, and a second insulating layer. Word lines are formed over the charge storage layer substantially perpendicular to the bit lines. Programming circuitry controls two bits per cell by applying a signal to the word line, which acts as a control gate, and changing bit line connections such that one bit is stored by source and drain being connected in one arrangement and a complementary bit is stored by the source and drain being interchanged in another arrangement.

The innovation is now described with reference to the drawings, wherein like reference numerals are used to refer to like elements throughout. In the following description, for purposes of explanation, numerous specific details are set forth in order to provide a thorough understanding of the innovation. It may be evident, however, that the innovation can be practiced without these specific details. In other instances, well-known structures and devices are shown in block diagram form in order to facilitate describing the innovation.

Although the top oxide replacement/improvement can be applied to any type of memory cell, the innovation is hereinafter illustrated and described in the context of an exemplary semiconductor device having one or more memory arrays containing dual bit memory cells arranged in a virtual ground type array architecture. FIG. 1 illustrates a top view of an exemplary dual bit flash memory device 100. The memory device 100 generally includes a semiconductor substrate 102 in which one or more high-density core regions 104 and one or more lower-density peripheral regions are formed. The high-density core regions 104 typically include one or more M by N arrays of individually addressable, substantially identical dual bit memory cells. The lower-density peripheral regions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
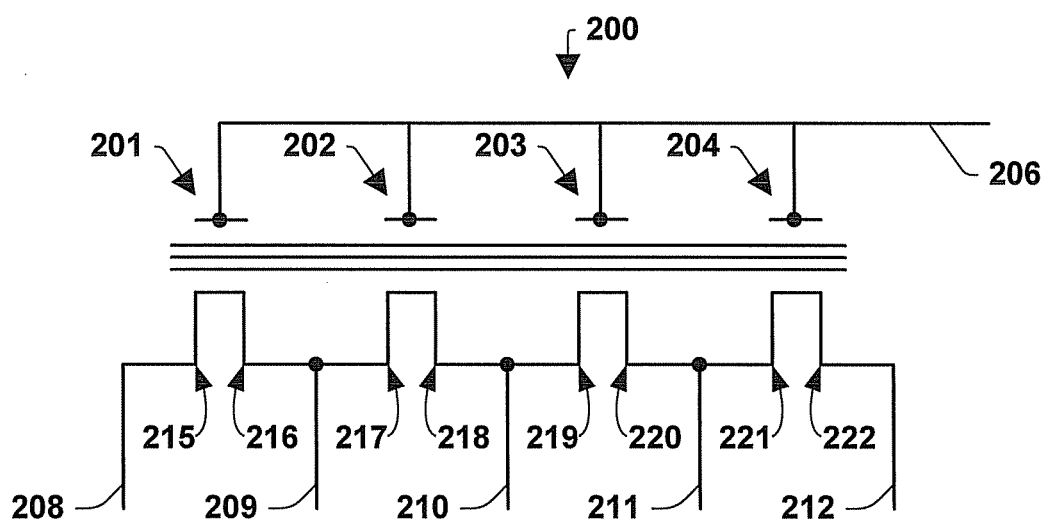
FIG. 2 illustrates removing a first poly in a core region of a memory device in accordance with an aspect of the subject invention.

FIG. 2 is a schematic illustration of a portion 200 of an exemplary memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a word line 206, which serves as a control gate, and pairs of the memory cells share a common bit line. For instance, in the example shown, the memory cell 201 associates bit lines 208 and 209; the memory cell 202 associates bit lines 209 and 210; the memory cell 203 associates bit lines 210 and 211; and the memory cell 204 associates bit lines 211 and 212. As such, cells 201 and 202 share bit line 209, cells 202 and 203 share bit line 210 and cells 203 and 204 share bit line 211, respectively.

Depending upon a signal on the word line and the connection of the bit lines in a memory cell to an electrical source or drain, the memory cells 201 through 204 are capable of writing, reading, and erasing bits at locations 215 through 222. For example, control of the bit at location 215 is achieved through connection of the drain to the bit line 208 and the source to the bit line 209. Similarly, control of the bit at location 216 is achieved through connection of the drain to the bit line 209 and the source to the bit line 208. It will be appreciated that although adjacent memory cells share common bit lines, the adjacent memory cells do not interfere with each other because the memory cells are typically programmed one at a time and in such instances only one memory cell is active at a time while programming.

Figure 3:
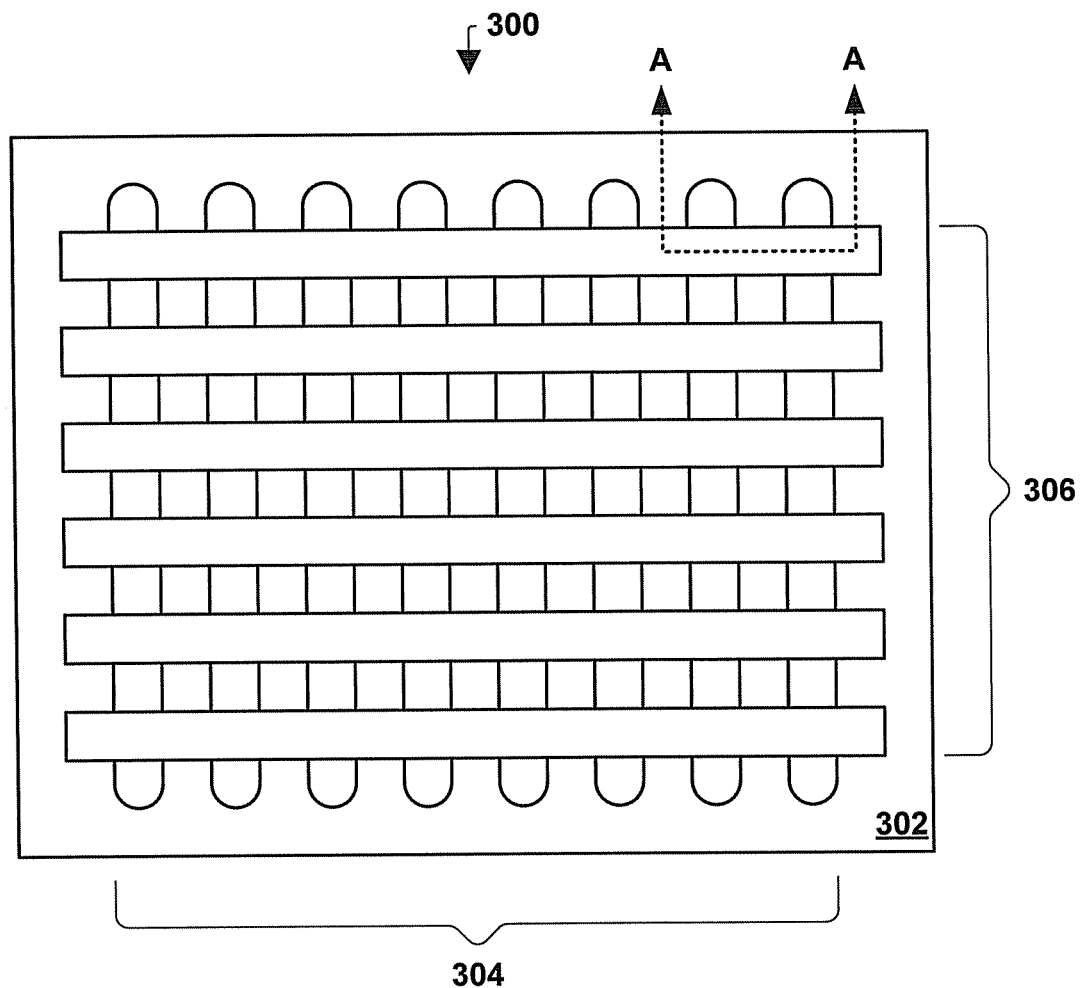
FIG. 3 illustrates a top view of a core region of an exemplary flash memory device in accordance with an aspect of the subject invention.

FIG. 3 illustrates a top view of at least a portion 300 of a memory core, such as may include at least part of one of the M by N array cores 104 depicted in FIG. 1. The memory 300 is formed upon a semiconductor substrate 302 and has a plurality of implanted bit lines 304 extending substantially parallel to one another, and further includes a plurality of formed word lines 306 extending substantially in parallel to one another and at substantially right angles to the plurality of implanted bit lines 304. The word lines 306 are disposed over and separated from the bit lines 304 by a dielectric stack (not shown) in a grid arrangement. The memory core 300 can include a bit line contact region (not shown) between word lines 306. The bit line contact region can be used to establish electrical connection to the bit lines through the dielectric stack. It will be appreciated that the word lines 304 and bit lines 306 have contacts and interconnections (not shown) to programming circuitry such as may be represented, at least in part, by x-decoders and y-decoders.

Figure 4:
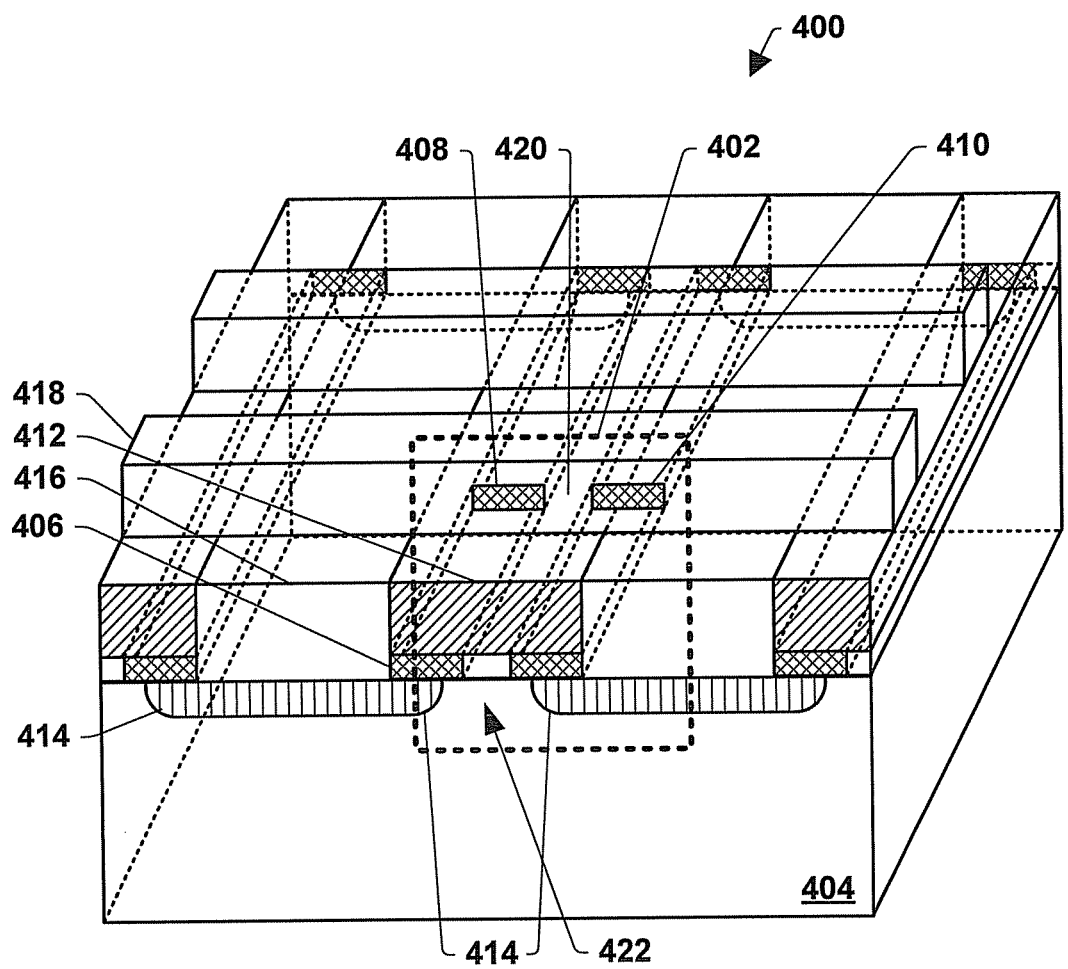
FIG. 4 is a cross-sectional isometric illustration of exemplary memory device, such as that taken along line A-A of FIG. 3 in accordance with an aspect of the subject invention.

FIG. 4 is a cross-sectional isometric illustration of a portion of a memory device 400 containing a dual bit memory cell 402 as indicated by a dashed line, such as that taken along line A-A of FIG. 3. The dual bit memory cell 402 is formed on a semiconductor substrate 404. The memory cell 402 contains a charge storage layer 406 containing two charge storage nodes 408, 410 on the semiconductor substrate 404; a first poly 412 on the charge storage layer 406; a pair of bit lines 414 in the semiconductor substrate 404 adjacent the charge storage layer 406 and under a bit line dielectric 416; and a word line 418. In one embodiment, the two charge storage nodes 408, 410 are physically separated by a central dielectric 420 in the charge storage layer 406. In another embodiment, the two charge storage nodes are not physically separated in a single charge storage layer (not shown). The memory cell 402 is separated from adjacent memory cells by the bit line dielectric 416 such as oxides (e.g., silicon oxide, high temperature oxide (HTO), high density plasma (HDP) oxide).

Since the memory cell 402 has the two charge storage nodes 408, 410, the memory cell 402 can store two physically distinct bits. Each bit within the memory cell 402 serves as a binary unit of data (e.g., either 1 or 0) that can be mapped directly to a memory array. Reading or programming one side of charge storage nodes 408, 410 can occur independently of whatever data is stored on the opposite side of the charge storage nodes 408, 410.

Two conductive bit lines 414 are depicted in FIG. 4 underlying the charge storage layer 406. It will be appreciated that any number of such bit lines can be implanted into the semiconductor substrate 404, and that such bit lines may correspond to the bit lines 304 depicted in FIG. 3. The bit lines 414 typically contain an implanted n-type material, such as arsenic, and may include an oxide portion (not shown) in some examples. The two conductive bit lines 414 are spaced apart and define a channel region 422 therebetween. The semiconductor substrate 404 can contain pocket implant regions (not shown) adjacent the charge storage layer 406. The pocket implant regions typically contain an implanted p-type material, such as boron. The pocket implant regions can facilitate controlling a threshold voltage of the memory cell 402.

Two conductive word lines 418 are similarly depicted overlying the charge storage layer 406. It will be appreciated that any number of such word lines can be formed over the charge storage layer 406, and that such word lines may correspond to the word lines 306 depicted in FIG. 3. The word lines 418 can contain a polysilicon material, for example, where the polysilicon material may be deposited over the charge storage layer 406 and then patterned and etched.

Locations 408 and 410 indicate generally where respective bits of data can be stored in a memory cell 402. It will be appreciated that the channel 422 has an effective length and that the bits will be brought closer together as this length is reduced (e.g., as a result of scaling).

Referring to FIGS. 5 to 9 and FIGS. 10 to 12, two of many possible exemplary embodiments of replacing a top oxide of a memory cell and/or improving quality of a top oxide of a memory cell are specifically illustrated. FIG. 5a illustrates a cross sectional view of an intermediate state of a portion of an exemplary memory device 500. The memory device 500 can contain one or more intermediate states of memory cells 502. The memory cell 502 can contain a charge storage layer 504, a first poly 506, and a bit line dielectric 508 over a semiconductor substrate 510. The charge storage layer 504 can contain a gate oxide 512, one or more charge storage elements 514, and a first top oxide 516. The semiconductor substrate 510 can contain bit lines 518 containing, for example, one or more n-type dopants (e.g., arsenic, phosphorous, antimony). The memory device 500 can further contain other layers/components. For example, the memory device 500 may contain a tunnel oxide (not shown) between the charge storage layer 504 and the semiconductor substrate 510. A portion of the charge storage layer 504 indicated by a dashed line 520 in FIG. 5a is exploded in FIG. 5b.

The semiconductor substrate 510 may contain any suitable semiconductor material on which electric devices such as memory cell transistors can be formed. Examples of semiconductor materials include silicon, gallium arsenide, indium phosphide, and the like.

The first poly 506 typically contains polysilicon. The first poly 506 can be formed on the semiconductor substrate 510 by, for example, chemical vapor deposition (CVD). The height of the first poly 506 may vary and is not critical to the subject invention. The height may depend on, for example, the desired implementations and/or the memory device 500 being fabricated. In one embodiment, the height of the first poly 506 is about 50 nm or more and 300 nm or less. In another embodiment, the height of the first poly 506 is about 60 nm or more and 200 nm or less. In yet another embodiment, the height of the first poly 506 is about 70 nm or more and 150 nm or less. In still yet another embodiment, the height of the first poly 506 is about 100 nm.

The bit line dielectric 508 can contain any suitable dielectric material. The memory cells 502 are typically separated from each other with the bit line dielectric 508. General examples of dielectrics include silicon based dielectric materials, oxide dielectric materials, silicates, low k materials, and the like. Examples of silicon based dielectric materials include silicon dioxide, silicon oxynitride, high density plasma (HDP) oxide, and the like. Examples of silicates include fluorine doped silicon glass (FSG), tetraethylorthosilicate (TEOS), borophosphotetraethylorthosilicate (BP-TEOS), phosphosilicate glass (PSG), borophosphosilicate glass (BPSG), other suitable spin-on glasses, and the like.

The bit line dielectric 508 can be formed by any suitable technique including CVD such as plasma enhanced CVD. The height of the bit line dielectric 508 may vary and is not critical to the subject invention. The bit line dielectric 508 can have any suitable height that depends on, for example, the desired implementations and/or the memory device 500 being fabricated. In one embodiment, the height of the bit line dielectric 508 is about 10 nm or more and 200 nm or less. In another embodiment, the height of the bit line dielectric 508 is about 20 nm or more and 100 nm or less. In yet another embodiment, the height of the bit line dielectric 508 is about 30 nm or more and 80 nm or less. In still yet another embodiment, the height of the bit line dielectric 508 is about 50 nm.

The charge storage layer 504 containing the gate oxide 512, the charge storage element 514, and the first top oxide 510 can be formed over the semiconductor substrate 510. The configuration and/or constituent of the charge storage layer 504 may vary and are not critical to the subject invention. In one embodiment, the charge storage layer 504 can contain single charge storage element 514 therein. In another embodiment, the charge storage layer 504 can contain two charge storage elements 514 therein. For example, the charge storage layer 504 can contain two charge storage elements 514 that are separated from each other by a central dielectric 522 such as oxides.

The gate oxide 512 can contain any suitable oxide material. Examples of oxide materials include silicon oxide. The gate oxide 512 can be formed on the semiconductor substrate 510 by any suitable technique. For example, the gate oxide 512 can be formed on the semiconductor substrate 510 by thermal oxidation, CVD, and the like.

The charge storage element 514 can contain any suitable dielectric material that can store and/or trap charges. The charge storage element 514 contains one or more layers containing the charge storage dielectric material. General examples of charge storage dielectric materials include nitrides (e.g., silicon nitride, silicon oxynitride, and silicon rich silicon nitride), oxides, silicates, a high-k dielectric, for example, having a dielectric constant higher than that of silicon dioxide ($SiO_2$), and the like. In one embodiment, the charge storage dielectric material contains silicon nitride, silicon oxynitride, and/or silicon rich silicon nitride. In another example, the charge storage dielectric material contains oxides or silicates containing Al, Ta, Hf, La, Zr, Ti, Nb, Cr, V, Y, Ce and/or Pr. The charge storage element 514 can be formed on the gate oxide 512 by any suitable technique. For example, the charge storage element 514 can be formed by CVD, lithography, and etching techniques.

The first top oxide 516 can contain any suitable oxide material. Examples of oxide materials include silicon oxide. The first top oxide 516 is formed around the surface of the charge storage element 514. The first top oxide 516 can be formed by any suitable technique. For example, the top oxide 516 can be formed by thermal oxidation, plasma oxidation, CVD, and the like.

In this example, the charge storage layer 504 contains two charge storage elements 514 and the space between the charge storage elements 514 on the semiconductor substrate 510 is filled with the first top oxide material (e.g., central dielectric 522). The oxide material at the space (e.g., central oxide 522) can be formed at any suitable time. For example, the central oxide 522 can be formed before the charge storage element 514 is defined/formed. The central oxide 522 can be formed at the same time that the charge storage element 514 and/or the first top oxide 516 are defined/formed. The central oxide 522 can be formed after the charge storage element 514 is defined/formed. In another embodiment, the space between the charge storage elements 514 on the semiconductor substrate 510 is not filled with the first top oxide material, and the first top oxide 516 is formed around only the surface of the charge storage element 514 (not shown).

The heights of the gate oxide 512 and first top oxide 516 may vary and are not critical to the subject invention. The gate oxide 512 and first top oxide 516 have independently any suitable height that depends on the desired implementations and/or the memory device 500 being fabricated. In one embodiment, the heights of the gate oxide 512 and first top oxide 516 are independently about 1 nm or more and about 10 nm or less. In another embodiment, the heights of the gate oxide 512 and first top oxide 516 are independently about 2 nm or more and about 8 nm or less. In yet another embodiment, the heights of the gate oxide 512 and first top oxide 516 are independently about 3 nm or more and about 7 nm or less. In still yet another embodiment, the heights of the gate oxide 512 and first top oxide 516 are about 5 nm.

The height of the charge storage element 514 may vary and is not critical to the subject invention. The charge storage element 514 has any suitable height that depends on the desired implementations and/or the memory device 500 being fabricated. In one embodiment, the height of the charge storage element 514 is about 1 nm or more and about 20 m or less. In another embodiment, the height of the charge storage element 514 is about 2 nm or more and about 15 nm or less. In yet another embodiment, the height of the charge storage element 514 is about 3 nm or more and about 10 nm or less. In still yet another embodiment, the height of the charge storage element 514 is about 7 nm.

Figure 5A:
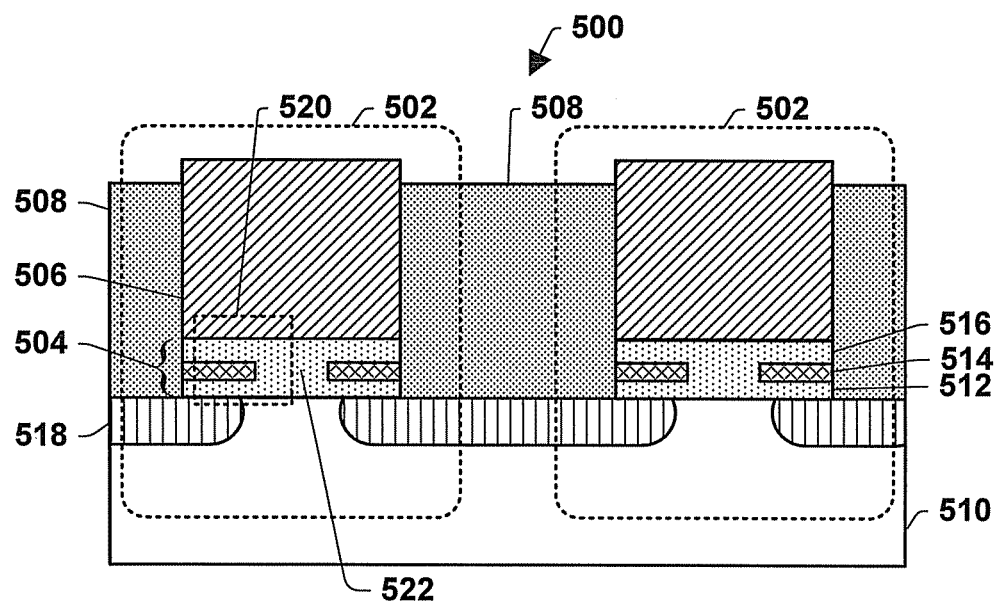
FIG. 5a illustrates a cross sectional view of an intermediate state of a portion of an exemplary memory device in accordance with a first aspect of the subject invention.
Figure 5B:
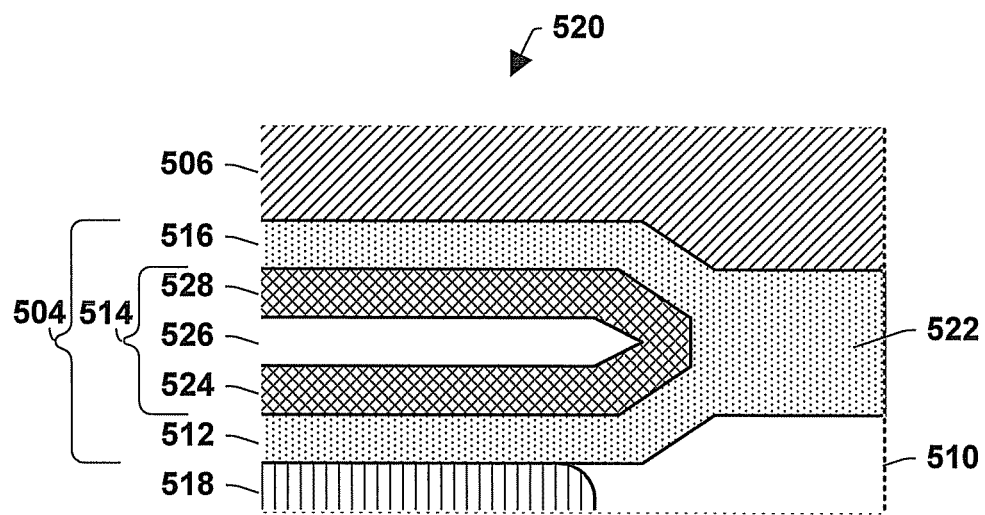
FIG. 5b illustrates an exploded view of an exemplary charge storage layer of FIG. 5a in accordance with a first aspect of the subject invention.

FIG. 5b illustrates an exploded view of an exemplary charge storage layer 504 of FIG. 5a. In this example, the charge storage layer 504 contains five separate layers, for example, oxide (gate oxide 512)/first charge storage dielectric material 524/polysilicon 526/second charge storage dielectric material 528/oxide (first top oxide 516). For example, the charge storage layer 504 contains five separate layers: gate oxide 512/first nitride 524/polysilicon 526/second nitride 528/first top oxide 516. The first and fifth oxide layers can contain any suitable oxides such as silicon dioxide ($SiO_2$). The first and second nitride layers can contain any suitable nitrides such as silicon nitride ($Si_xN_y$). That is, the charge storage element 514 can contain nitrides such as silicon nitrides.

The oxide/nitride/polysilicon/nitride/oxide configuration may be referred to as an ORPRO layer when the first and second nitrides contain silicon rich silicon nitride. The oxide/nitride/polysilicon/nitride/oxide layer can be fabricated by forming a first silicon oxide layer, forming a first silicon rich silicon nitride layer on the first silicon oxide layer, forming a poly layer on the first silicon rich silicon nitride, forming a second silicon rich silicon nitride on the poly layer, forming a second silicon oxide layer on the second silicon rich silicon nitride, and forming a first top oxide layer on the second silicon rich silicon nitride layer. The fabrication process of the oxide/nitride/polysilicon/nitride/oxide layer can include CVD, masking, lithography, and etching techniques. In one embodiment, the edges of the first and second charge storage dielectric layers are contacted with each other, and the edge of the poly layer is wrapped with the first and second charge storage dielectric layers. In another embodiment, the thickness of the central dielectric 522 is smaller than the thickness of the charge storage layer 504. In yet another embodiment, the thickness of the central dielectric 522 is substantially equal to the thickness of the charge storage layer 504 (not shown).

Although not shown in FIG. 5b, the charge storage layer 504 can contain three separate layers: oxide (gate oxide)/charge storage dielectric material (charge storage element)/oxide (first top oxide). The oxide/nitride/oxide configuration may be referred to as an ONO layer. Especially, when the nitride layer contains silicon rich silicon nitride, the oxide/nitride/oxide configuration may be referred to as an ORO tri-layer. The oxide/nitride/oxide tri-layer can be fabricated by forming a first silicon oxide layer, forming a silicon nitride layer on the first silicon oxide layer, and forming a second silicon oxide layer on the silicon nitride layer.

Figure 6A:
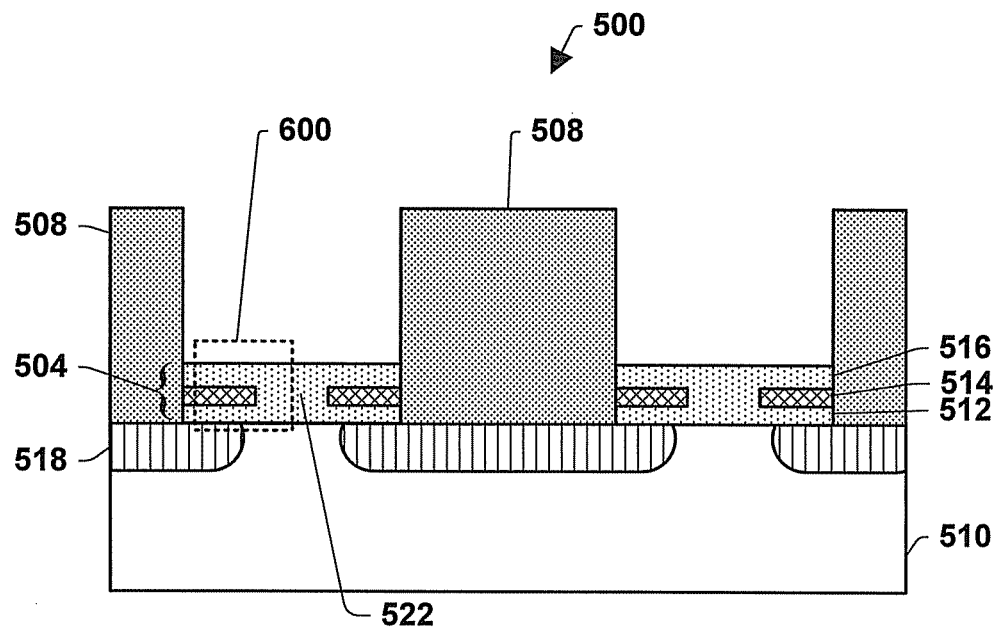
FIG. 6a illustrates removing the first poly from the memory device in accordance with a first aspect of the subject invention.

FIG. 6a illustrates removing the first poly 506 from the memory device 500. A portion of the charge storage layer 504 after removing the first poly 506 indicated by a dashed line 600 in FIG. 6a is exploded in FIG. 6b. The first poly 506 can be removed by, for example, etching. For example, the first poly 506 can be removed by contacting the first poly 506 with any suitable poly etchant that does not substantially affect or damage the integrity of other components/layers of the memory device 500. The poly etching can be dry etching or wet etching. Examples of dry etching include plasma etching, reactive ion etching (RIE), and the like. For example, the plasma etching is performed with chlorinating agents such as $Cl_2$ or a combination of $BCl_3$ and a halogenated hydrocarbon. The poly etch can also be performed with combinations of, for example, $SiCl_4$, $BCl_3$, HBr, $Br_2$, $SF_6$, and $CF_4$. Additives such as $N_2$, $O_2$, Ar, He, or any other noble gas can be included. Other examples of the poly etchants include tetraalkylammonium hydroxides (e.g., tetramethylammonium hydroxide (TMAH)) and alkali metal hydroxides (e.g., a potassium hydroxide (KOH) and cerium hydroxide (CeOH)).

Figure 6B:
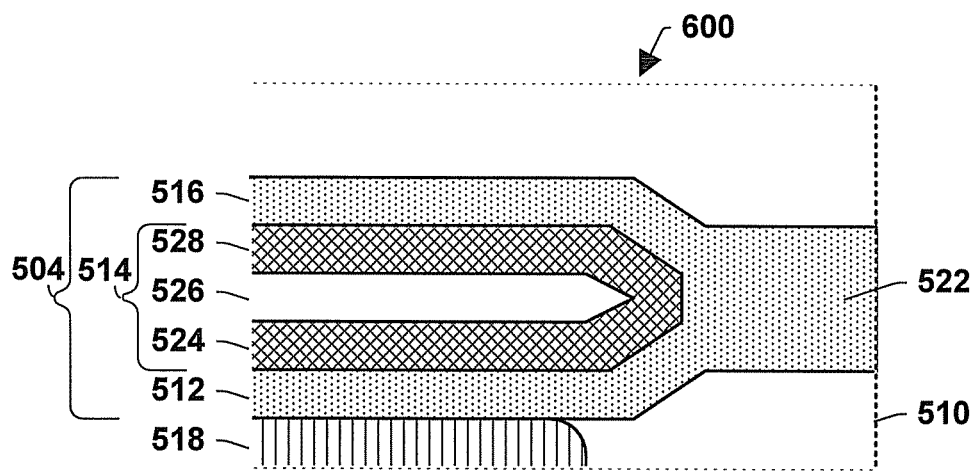
FIG. 6b illustrates an exploded view of a portion of an exemplary charge storage layer indicated by a dashed line in FIG. 6a after removing the first poly from the memory device in accordance with a first aspect of the subject invention.

FIG. 6b illustrates an exploded view of a portion of an exemplary charge storage layer 504 indicated by a dashed line 600 in FIG. 6a after removing the first poly 506 from the memory device 500. In this example, the charge storage layer 504 contains five separate layers: gate oxide 512/first charge storage dielectric material 524/polysilicon 526/second charge storage dielectric material 528/first top oxide 516. Since the first poly 506 is removed from the memory device 500, the first top oxide 516 of the charge storage layer 504 is exposed. The charge storage element 514 contains the first and second charge storage dielectric materials 524, 528. When the space between the two charge storage elements 514 is filled with an oxide material (e.g., central oxide 522), the central oxide 522 is also exposed.

Figure 7A:
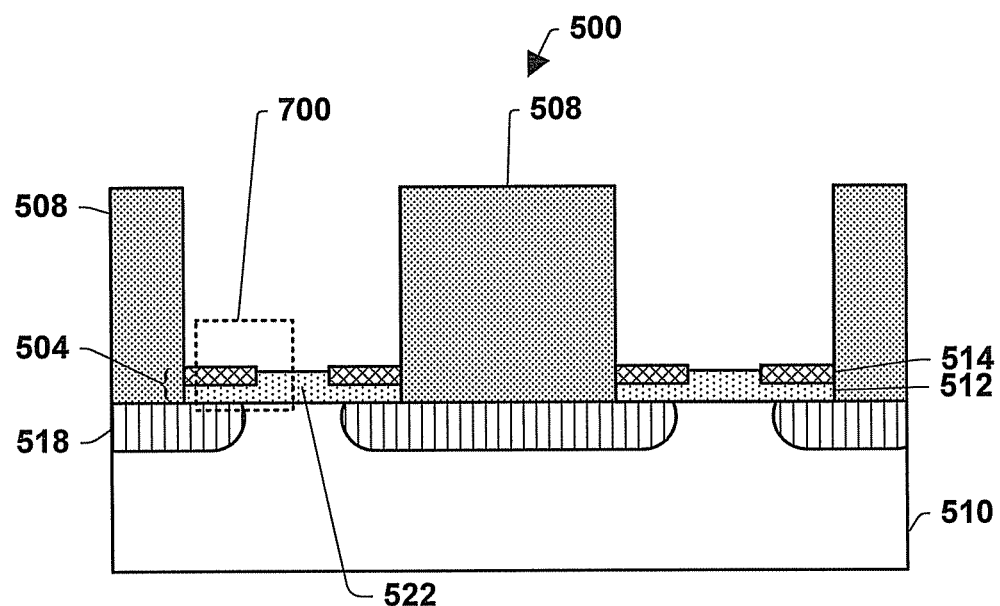
FIG. 7a illustrates removing the first top oxide from the memory device in accordance with a first aspect of the subject invention.

FIG. 7a illustrates removing the first top oxide 516 from the memory device 500. A portion of the charge storage layer 504 after removing the first top oxide 516 indicated by a dashed line 700 is exploded in FIG. 7b. The first top oxide 516 can be removed by, for example, etching. The first top oxide 516 can be removed by contacting the first top oxide 516 with any suitable oxide etchant that does not substantially affect or damage the integrity of other components/layers of the memory device 500. The oxide etching can be dry etching or wet etching. Examples of oxide etchants include halogen acids such as hydrofluoric acid. In one embodiment, the oxide etchant is a hydrofluoric acid solution such as a buffered hydrofluoric acid (BHF: e.g., hydrofluoric acid-ammonium fluoride buffered solution). In another embodiment, the oxide etchant is a vapor of hydrofluoric acid. In yet another embodiment, the first top oxide 516 is removed by an oxide etchant gas, such as $SiCl_4/Cl_2$, $BCl_3/Cl_2$, $CCl_4$, mixtures of fluorinated or chlorinated gases, mixtures of Freon-based gases, and the like.

When the charge storage layer 504 contains two charge storage elements 514 and the space between the two charge storage elements 514 is filled with the top oxide material (e.g., central oxide 522), the central oxide 522 can be partially or entirely removed by the first top oxide removing process. Any suitable amount of the central oxide 522 can be removed. In one embodiment, the central oxide 522 above the upper surface of the charge storage element 514 is removed, and the central oxide 522 below the upper surface of the charge storage element 514 is remained. In another embodiment, substantially all of the central oxide 522 is removed (not shown). In yet another embodiment, the central oxide 522 around only the charge storage element 514 is removed (not shown).

Figure 7B:
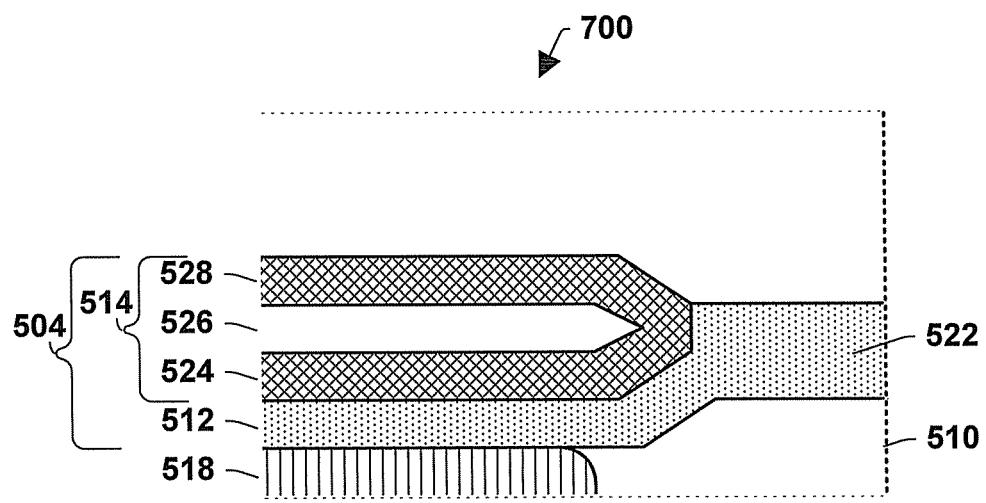
FIG. 7b illustrates an exploded view of a portion of an exemplary charge storage layer indicated by a dashed line in FIG. 7a after removing the first top oxide from the memory device in accordance with a first aspect of the subject invention.

FIG. 7b illustrates an exploded view of a portion of an exemplary charge storage layer 504 indicated by a dashed line 700 in FIG. 7a after removing the first top oxide 516 from the memory device 500. In this example, the charge storage layer 504 contains four separate layers: gate oxide 512/first charge storage dielectric material 524/polysilicon 526/second charge storage dielectric material 528. Since the first top oxide 516 is removed from the memory device 500, the second charge storage dielectric material 528 is exposed. Also, in this example, the space between the charge storage elements 514 is filled with an oxide material (e.g., central oxide 522), and the upper portion of the central oxide 522 is removed by the first top oxide removing process.

Figure 8A:
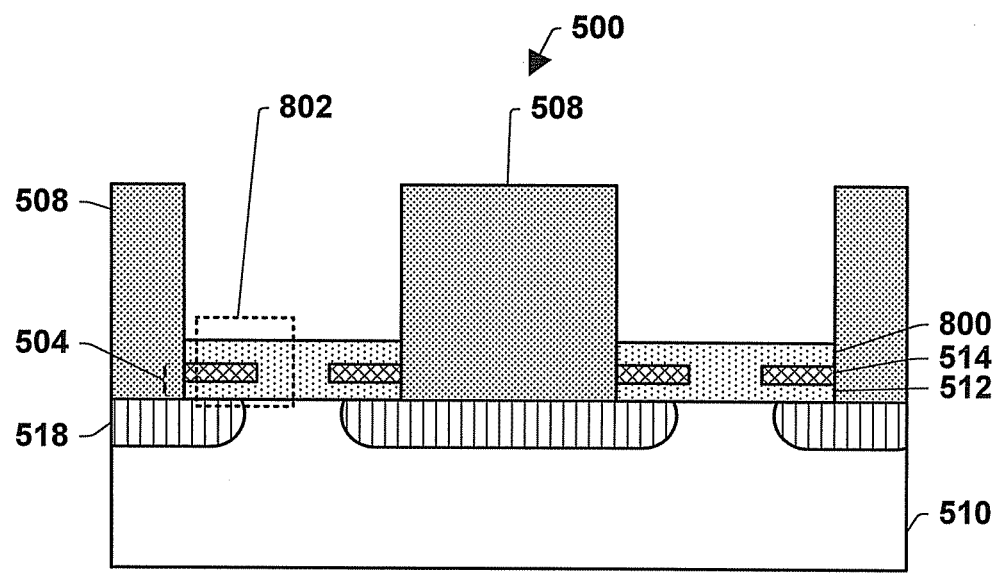
FIG. 8a illustrates forming a second top oxide around the charge storage element in accordance with a first aspect of the subject invention.

FIG. 8a illustrates forming a second top oxide 800 around the charge storage element 514. A portion of the charge storage layer 504 after forming the second top oxide 800 indicated by a dashed line 802 is exploded in FIG. 8b. By reforming a top oxide, a high quality second top oxide can be provided around the charge storage element 514.

The second top oxide 800 can be formed by any suitable technique. For example, the second top oxide 800 is formed by thermal oxidation techniques, deposition techniques such as CVD or spin-on techniques, and the like. In one embodiment, the second top oxide 800 is formed by oxidizing a portion of the charge storage element 514, for example, an upper portion of the charge storage element 514. When the central dielectric 522 at the space between the two charge storage elements 514 is partially or entirely removed in the previous process in connection with FIG. 7a, an oxide material can be reformed at the space between the two charge storage elements 514 at the same time that the second top oxide 800 is formed around the charge storage element 514.

Any suitable oxide material can be employed for the second top oxide 800. Examples of oxide materials include a high temperature oxide, low temperature oxide, and the like. In one embodiment, the second top oxide 800 is grown around the charge storage element 514 in plasma at low temperatures, e.g., plasma-grown oxide. For example, the second top oxide 800 contains plasma-grown oxide that is grown at a temperature of about 200 degrees Celsius or more and about 600 degrees Celsius or less. In another embodiment, the second top oxide 800 is formed around the charge storage element 514 using a slot plane antenna (SPA) process. In the SPA process, the plasma-grown oxide is grown in a chamber that includes a microwave slot antenna, which is used to generate the plasma. The microwave slot antenna can be configured to provide a plasma distribution that results in a plasma-grown oxide having increased uniformity, conformity, and quality compared to conventional plasma oxide. In the SPA process, the species used to grow the oxide can contain one or more of oxygen, argon, or hydrogen, for example. In yet another embodiment, the second top oxide 800 is a steam oxide that is grown around the charge storage elements 514 by heating the charge storage elements 514 in the presence of steam.

In one embodiment, the second top oxide 800 is formed by a low temperature oxidation process such as a low temperature radical oxidation, a low temperature plasma oxidation process, and the like. The low temperature oxidation may advantageously not change the electrical properties of components/layer of the memory device 500. For example, the low temperature oxidation does advantageously not change the doping profile of implanted regions of the semiconductor substrate 510. Any suitable oxygen reactant can be employed in the low temperature oxidation process. For example, atomic oxygen, ozone, ionized oxygen radicals produced in a plasma can be employed. In one embodiment, the second top oxide 800 is formed at a temperature of about 200 degrees Celsius or more and about 600 degrees Celsius or less. In another embodiment, the second top oxide 800 is formed at a temperature of about 220 degrees Celsius or more and about 550 degrees Celsius or less. In yet another embodiment, the second top oxide 800 is formed at a temperature of about 240 degrees Celsius or more and about 500 degrees Celsius or less.

The height of the second top oxide 800 may vary and is not critical to the subject invention. The second top oxide 800 has any suitable height that depends on the desired implementations and/or the memory device 500 being fabricated. In one embodiment, the height of the second top oxide 800 is about 1 nm or more and about 10 nm or less. In another embodiment, the height of the second top oxide 800 is about 2 nm or more and about 8 nm or less. In yet another embodiment, the height of the second top oxide 800 is about 3 nm or more and about 7 nm or less. In still yet another embodiment, the height of the second top oxide 800 is about 5 nm.

Figure 8B:
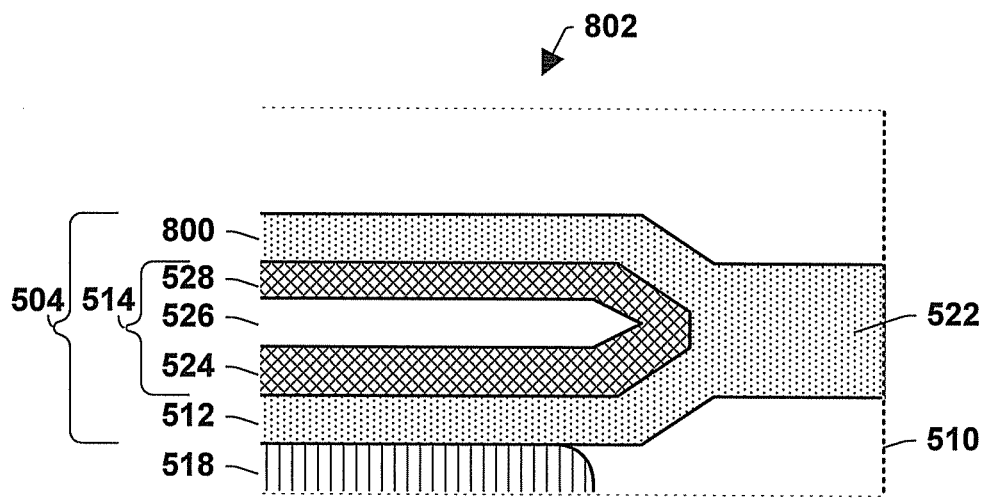
FIG. 8b illustrates an exploded view of a portion of an exemplary charge storage layer indicated by a dashed line in FIG. 8a after forming the second top oxide around the charge storage element in accordance with a first aspect of the subject invention.

FIG. 8b illustrates an exploded view of a portion of an exemplary charge storage layer 504 indicated by a dashed line 802 in FIG. 8a after forming the second top oxide 800 around the charge storage element 514. In this example, the charge storage layer 504 contains five separate layers: gate oxide 512/first charge storage dielectric material 524/polysilicon 526/second charge storage dielectric material 528/second top oxide 800. The second top oxide 800 can be formed around the second charge storage dielectric material 528 by, for example, a SPA process. Also, in this example, the oxide material at the space between the two charge storage elements 514 (e.g., central oxide 522) becomes thicker by the SPA process during the second top oxide forming process. In one embodiment, the charge storage element 514 (e.g., second charge storage dielectric material 528) becomes thinner during the second top oxide forming process. For example, when the second top oxide 800 is formed by oxidizing the upper portion of the charge storage element 514 (e.g., the second charge storage dielectric material 528), the charge storage element 514 becomes thinner by the oxidation.

Figure 9A:
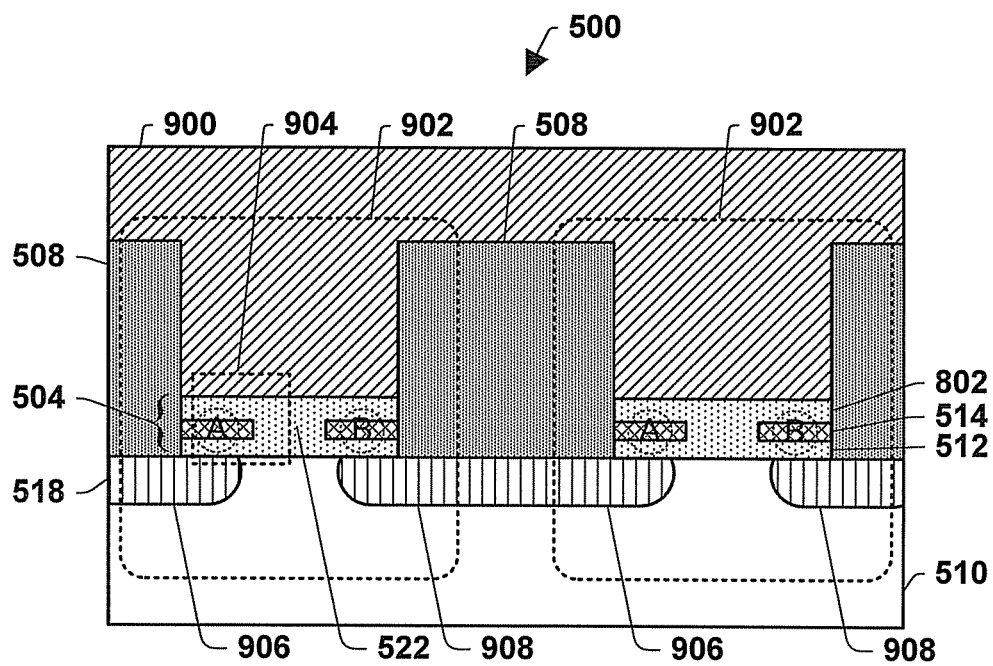
FIG. 9a illustrates forming a second poly over the semiconductor substrate, thereby forming a memory cell having improved quality of the second top oxide around the charge storage element in accordance with a first aspect of the subject invention.

FIG. 9a illustrates forming a second poly 900 over the semiconductor substrate 510, thereby forming a memory cell 902 having improved quality of the second top oxide 800 around the charge storage element 514. A portion of the charge storage layer 504 after forming the second poly 900 indicated by a dashed line 904 is exploded in FIG. 9b. The second poly 900 typically contains polysilicon. The second poly 900 can be formed on the semiconductor substrate 510 by, for example, CVD. The second poly may be a word line of the memory device 500.

The height of the second poly 900 may vary and is not critical to the subject invention. The second poly 900 can have any suitable height that depends on, for example, the desired implementations and/or the memory device 500 being fabricated. In one embodiment, the height of the second poly 900 is about 20 nm or more and 200 nm or less. In another embodiment, the height of the second poly 900 is about 30 nm or more and 150 nm or less. In yet another embodiment, the height of the second poly 900 is about 40 nm or more and 100 nm or less. In still yet another embodiment, the height of the second poly 900 is about 60 nm.

When the charge storage elements 514 are separated from each other by the central dielectric 522, the memory cell 902 contains physically and electrically separated two charge storage nodes. Since the charge storage nodes can store at least a bit of information, respectively, the memory cell 902 is capable of storing two spatially separated binary data bits, including a left bit represented by the dashed circle A and a right bit represented by the dashed circle B. The central dielectric 522 can prevent and/or mitigate undesirable signal crossover (e.g., crosstalk) between the two separated charge storage nodes. As a result, the resultant memory cell 902 can provide exceptional read and write performance.

When the memory cell 902 is such a dual-bit memory cell, the dual-bit memory cell 902 is generally symmetrical, wherein a drain and a source are interchangeable, although asymmetric implementations are possible within the scope of the invention. In the exemplary memory cell 902, the left bit lines 906 may serve as the source terminal and the right bit lines 908 as the drain terminal with respect to the right bit. Likewise, the right bit lines 908 may serve as the source terminal and the left bit lines 906 as the drain terminal for the left bit. The subject invention may be implemented in association with various single or multi-bit memory cell types including a SONOS cell. In addition, the invention is applicable to such dual-bit memory devices wherein both bits are used for data or information storage, as well as those in which only one bit (e.g., bit A) of the dual-bit cell is so used.

Figure 9B:
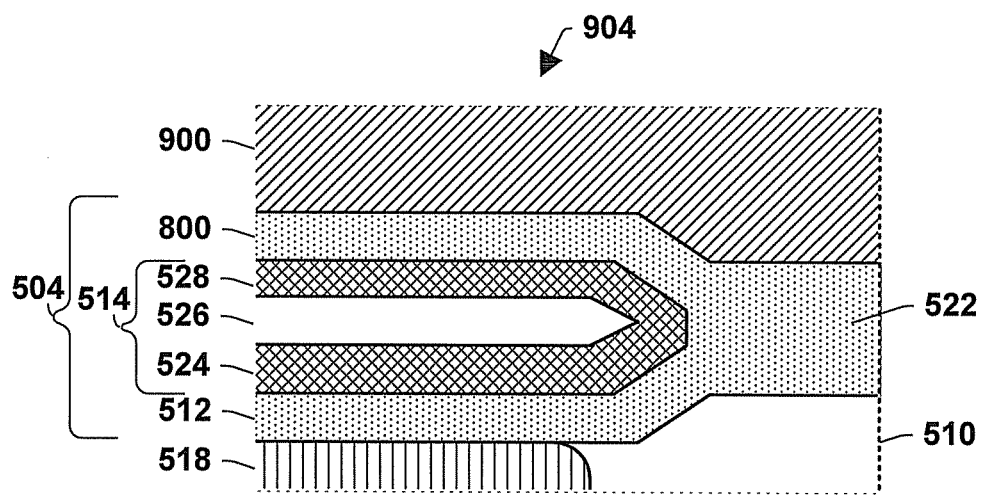
FIG. 9b illustrates an exploded view of a portion of an exemplary charge storage layer indicated by a dashed line in FIG. 9a after forming the second poly over the semiconductor substrate in accordance with a first aspect of the subject invention.

FIG. 9b illustrates an exploded view of a portion of an exemplary charge storage layer 504 indicated by a dashed line 904 in FIG. 9a after forming the second poly 900 over the semiconductor substrate 510. In this example, the charge storage layer 504 contains five separate layers: gate oxide 512/first charge storage dielectric material 524/polysilicon 526/second charge storage dielectric material 528/second top oxide 800.

Figure 10A:
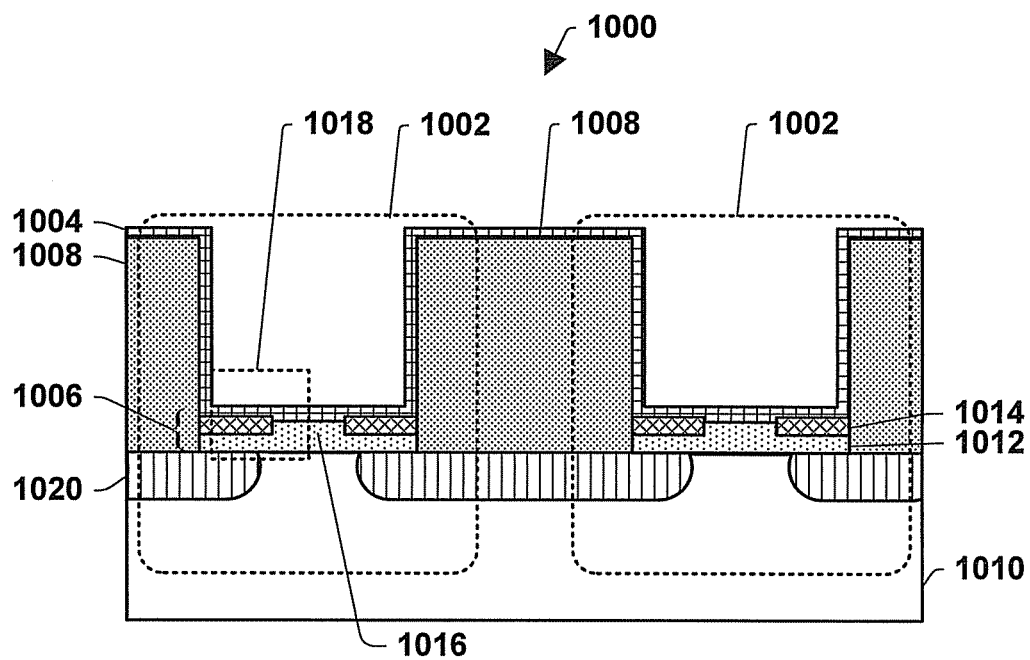
FIG. 10a illustrates a cross sectional view of an intermediate state of a portion of another exemplary memory device in accordance with a second aspect of the subject invention.

FIG. 10a illustrates a cross sectional view of an intermediate state of a portion of another exemplary memory device 1000. The intermediate memory device 1000 can contain one or more intermediate states of memory cells 1002. The intermediate state of the memory cell 1002 contains the same structure as the intermediate state of the memory cell 500 in connection with FIG. 7a except a sacrificial layer 1004. The intermediate memory cell 1002 can contain an intermediate state of a charge storage layer 1006, the sacrificial layer 1004, and a bit line dielectric 1008 over a semiconductor substrate 1010. The intermediate charge storage layer 1006 can contain a gate oxide 1012 and one or more charge storage elements 1014. In this example, a first top oxide is removed from the memory device 1000 and the charge storage layer 1006 does not contain a first top oxide around the charge storage element 1014. A top oxide is formed in subsequent processes. Also in this example, the intermediate charge storage layer 1006 contains two charge storage elements 1014 therein, and the two charge storage elements 1014 are separated from each other by a central oxide 1016. A portion of the charge storage layer 1006 indicated by a dashed line 1018 is exploded in FIG. 10b.

The semiconductor substrate 1010 can contain bit lines 1020 containing, for example, one or more n-type dopants (e.g., arsenic, phosphorous, antimony). The memory device 1000 can further contain other layers/components. For example, the memory device 1000 may contain a tunnel oxide (not shown) between the charge storage layer 1006 and the semiconductor substrate 1010.

The sacrificial layer 1004 can contain any suitable material that can be converted to a second top oxide in a subsequent process. For example, the sacrificial layer 1004 contains materials that can be oxidized in a subsequent process to provide a high quality second top oxide around the charge storage element 1014. Examples of sacrificial layer materials include nitrides such as silicon nitride ($Si_3N_4$); oxides such as hafnium silicon oxide (HfSiO), hafnium oxide ($HfO_2$), aluminum oxide ($Al_2O_3$); and the like. When the sacrificial layer 1004 contains oxides, the sacrificial layer 1004 can be further or fully oxidized in a subsequent oxidation process.

The sacrificial layer 1004 can be formed by any suitable technique. For example, the sacrificial layer 1004 is formed by CVD such as plasma enhanced chemical vapor deposition (PECVD), low pressure chemical vapor deposition (LPCVD), high pressure chemical vapor deposition (HPCVD), and the like. The sacrificial layer 1004 is formed around at least the charge storage elements 1014.

The height of the sacrificial layer 1004 may vary and is not critical to the subject invention. The sacrificial layer 1004 has any suitable height that depends on the desired implementations and/or the memory device 1000 being fabricated. In one embodiment, the height of the sacrificial layer 1004 is about 0.2 nm or more and about 5 nm or less. In another embodiment, the height of the sacrificial layer 1004 is about 0.5 nm or more and about 4 nm or less. In yet another embodiment, the height of the sacrificial layer 1004 is about 1 nm or more and about 3 nm or less.

Figure 10B:
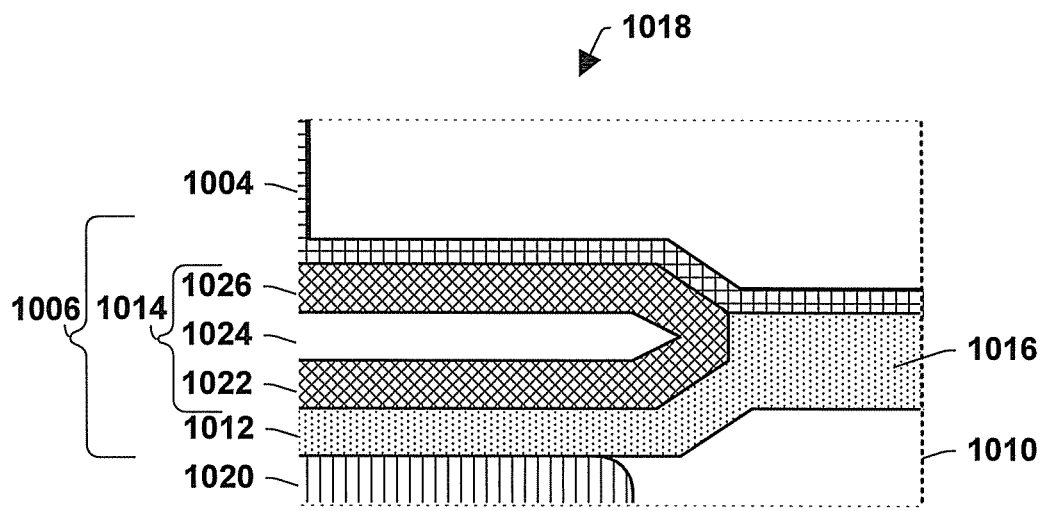
FIG. 10b illustrates an exploded view of a portion of an exemplary intermediate charge storage layer indicated by a dashed line in FIG. 10a in accordance with a second aspect of the subject invention.

FIG. 10b illustrates an exploded view of a portion of an exemplary intermediate charge storage layer 1006 indicated by a dashed line 1018 in FIG. 10a. In this example, the intermediate charge storage layer 1006 contains a central dielectric 1016 and four separate layers: gate oxide 1012/first charge storage dielectric material 1022/polysilicon 1024/second charge storage dielectric material 1026. In this example, the sacrificial layer 1004 such as silicon rich silicon nitride is formed over the central dielectric 1016 and the second charge storage dielectric material 1026.

Figure 11A:
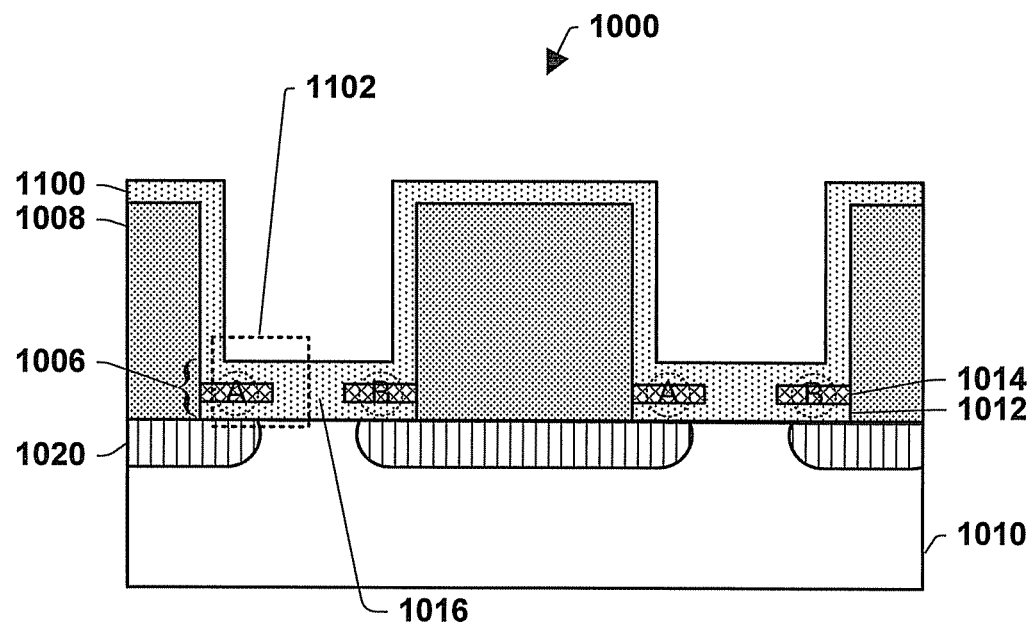
FIG. 11a illustrates converting the sacrificial layer to an oxide layer in accordance with a second aspect of the subject invention.

FIG. 11a illustrates converting the sacrificial layer 1004 to an oxide layer 1100. A portion of the intermediate charge storage layer 1006 indicated by a dashed line 1102 is exploded in FIG. 11b. The oxide layer 1100 can be formed by, for example, oxidizing the sacrificial layer 1004.

The sacrificial layer 1004 can be oxidized by any suitable technique. For example, the sacrificial layer 1004 is oxidized by thermal oxidation, plasma oxidation, liquid chemical oxidation, combinations thereof, and the like. In the thermal oxidation, the sacrificial layer 1004 is oxidized at elevated temperatures in an $O_2$ atmosphere. In one embodiment, the sacrificial layer 1004 is oxidized at about 600 degrees Celsius or more and about 800 degrees Celsius or less. In the plasma oxidation, the sacrificial layer 1004 is oxidized by using a plasma gas containing oxygen ($O_2$), ozone ($O_3$), nitrous oxide ($N_2O$), or the like at a temperature of about 200 degrees Celsius or more and about 600 degrees Celsius or less. A HDP process or SPA process may be employed to oxidize the sacrificial layer 1004. In the liquid chemical oxidation, the sacrificial layer 1004 is contacted with, for example, a liquid mixture of sulfuric acid and hydrogen peroxide water; ozone water; and the like at a temperature of about 10 degrees Celsius or more and about 600 degrees Celsius or less. These oxidation processes may be employed individually or in combination. For example, after the plasma oxidation is performed, the liquid chemical processing can be performed.

In one embodiment, the sacrificial layer 1004 is oxidized by a low temperature oxidation process such as a low temperature radical oxidation, a low temperature plasma oxidation process, and the like. The low temperature oxidation may advantageously not change the electrical properties of components/layer of the memory device 1000. For example, the low temperature oxidation does advantageously not change the doping profile of implanted regions in the semiconductor substrate 1010. Any suitable oxygen reactant can be employed in the low temperature oxidation process. For example, atomic oxygen, ozone, ionized oxygen radicals produced in a plasma can be employed. In one embodiment, the sacrificial layer 1004 is oxidized at a temperature of about 200 degrees Celsius or more and about 600 degrees Celsius or less. In another embodiment, the sacrificial layer 1004 is oxidized at a temperature of about 220 degrees Celsius or more and about 550 degrees Celsius or less. In yet another embodiment, the sacrificial layer 1004 is oxidized at a temperature of about 240 degrees Celsius or more and about 500 degrees Celsius or less.

The height of the oxide layer 1100 can be controlled by, for example, adjusting oxidation conditions. The height of the oxide layer 1100 may vary and is not critical to the subject invention. The oxide layer 1100 has any suitable height that depends on the desired implementations and/or the memory device 1000 being fabricated. In one embodiment, the height of the oxide layer 1100 is about 1 nm or more and about 10 nm or less. In another embodiment, the height of the oxide layer 1100 is about 2 nm or more and about 8 nm or less. In yet another embodiment, the height of the oxide layer 1100 is about 3 nm or more and about 7 nm or less. In still yet another embodiment, the height of the oxide layer 1100 is about 5 nm.

Figure 11B:
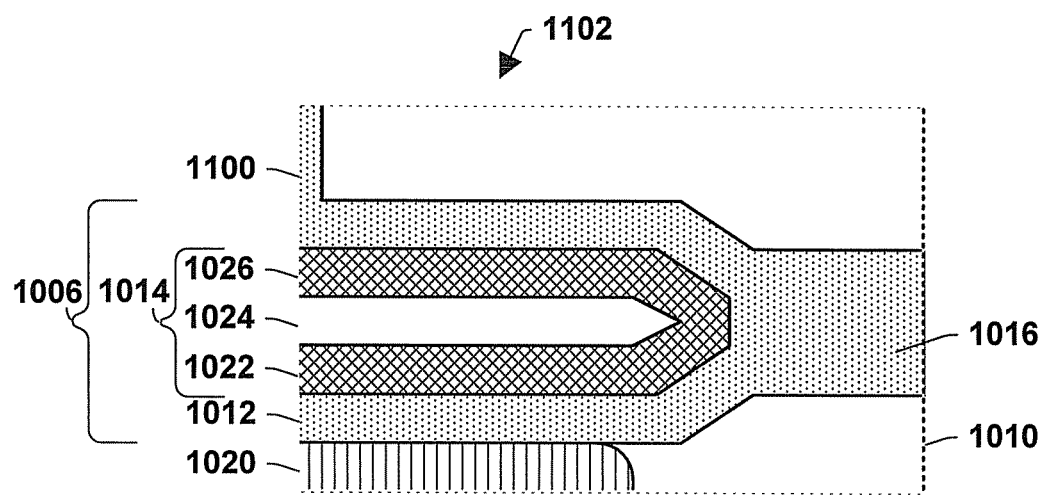
FIG. 11b illustrates an exploded view of a portion of an exemplary intermediate charge storage layer indicated by a dashed line in FIG. 11a after converting the sacrificial layer to the oxide layer in accordance with a second aspect of the subject invention.

FIG. 11b illustrates an exploded view of a portion of an exemplary intermediate charge storage layer 1006 indicated by a dashed line 1102 in FIG. 11a after converting the sacrificial layer 1004 to the oxide layer 1100. In this example, the intermediate charge storage layer 1006 contains the central dielectric 1016 and four separate layers: gate oxide 1012/first charge storage dielectric material 1022/polysilicon 1024/second charge storage dielectric material 1026. In this example, the oxide layer 1100 is formed over the central dielectric 1016 and the second charge storage dielectric material 1016. In this example, the sacrificial layer 1004 contains silicon rich silicon nitride oxides, and the oxide layer 1100 contains silicon oxides formed by oxidizing the sacrificial layer 1004 by a SPA process.

Figure 12A:
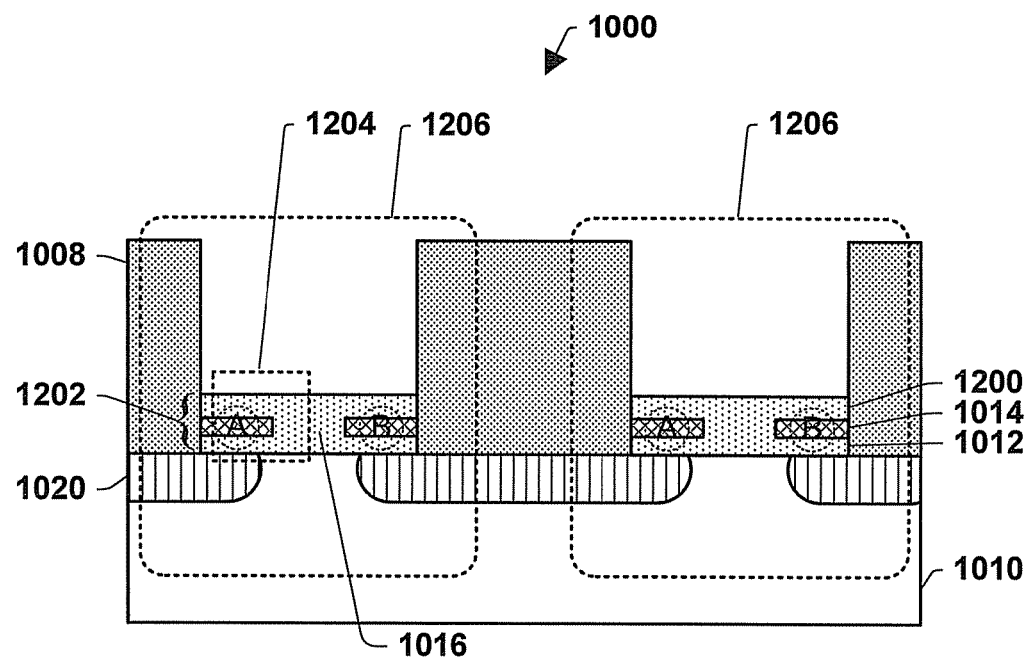
FIG. 12a illustrates removing portions of the oxide layer on the bit line dielectric, thereby forming a second top oxide in accordance with a second aspect of the subject invention.

FIG. 12*a* illustrates removing portions of the oxide layer 1100 on the bit line dielectric 1008, thereby forming a second top oxide 1200. Portions of the oxide layer 1100 around the charge storage elements 1014 are not removed. As a result, the second top oxide 1200 is formed around the charge storage elements 1014 of the intermediate charge storage layer 1006, thereby forming a complete charge storage layer 1202. A portion of the charge storage layer 1202 indicated by a dashed line 1204 is exploded in FIG. 12*b*.

Portions of the oxide layer 1100 on the bit line dielectric 1008 are removed while portions of the oxide layer 1100 around the charge storage element 1014 are not removed. This can be performed by, for example, masking, lithography, and etching techniques. The portions of the oxide layer 1100 around the charge storage element 1014 are protected by a mask (not shown). The mask can be formed around the charge storage element 1014 by, for example, depositing a resist over the semiconductor substrate 1010, exposing the resist to a pattern of radiation, and developing the resist into the pattern to cover the charge storage element 1014.

The portions of the oxide layer 1100 on the bit line dielectric 1008 that are not covered by the mask can be removed by contacting the portions with any suitable oxide etchant that does not substantially affect or damage the integrity of other components/layers of the memory device 1000. For example, the exposed portions of the oxide layer 1100 on the bit line dielectric 1008 are removed in the same manner as described in connection with the removal of the first top oxide in FIG. 7*a*.

Although not shown, a second poly can be formed over the semiconductor substrate 1010, thereby forming a memory cell 1206 having improved quality of the second top oxide 1200 around the charge storage element 1014. The second poly can be formed by any suitable technique. For example, the second poly is formed in the same manner as described in connection with the formation of the second poly 900 in FIG. 9*a*.

When the charge storage elements 1014 are separated from each other by the central dielectric 1016, the memory cell 1206 contains physically and electrically separated two charge storage nodes. Since the charge storage nodes can store at least a bit of information, respectively, the memory cell 1206 is capable of storing two spatially separated binary data bits, including a left bit represented by the dashed circle A and a right bit represented by the dashed circle B. The central dielectric 1016 can prevent and/or mitigate undesirable signal crossover (e.g., crosstalk) between the two separated charge storage nodes. As a result, the resultant memory cell 1206 can provide exceptional read and write performance.

Figure 12B:
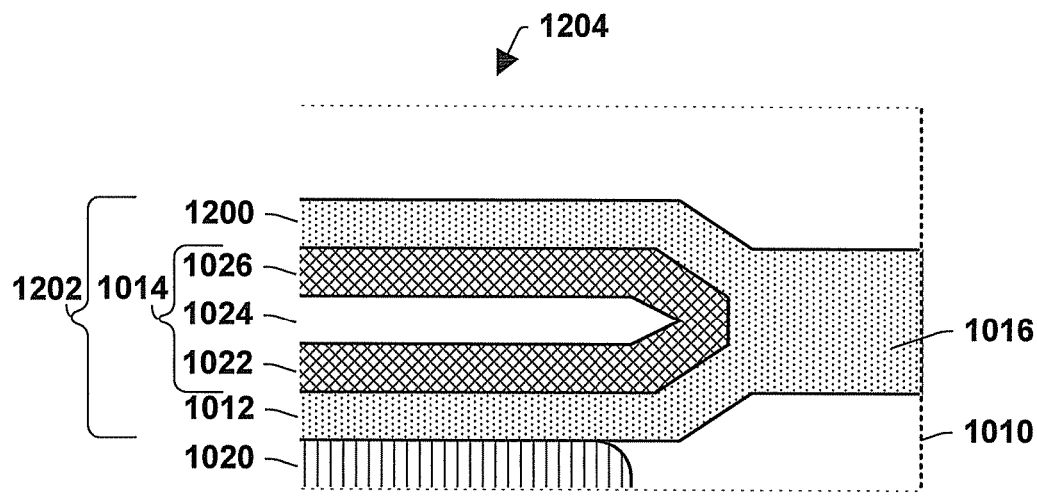
FIG. 12b illustrates an exploded view of a portion of an exemplary resultant charge storage layer indicated by a dashed line in FIG. 12a after removing portions of the oxide layer on the bit line dielectric in accordance with a second aspect of the subject invention.

FIG. 12*b* illustrates an exploded view of a portion of an exemplary resultant charge storage layer 1202 indicated by a dashed line 1204 in FIG. 12*a* after removing portions of the oxide layer 1100 on the bit line dielectric 1008. In this example, the charge storage layer 1202 contains five separate layers: gate oxide 1012/first charge storage dielectric material 1022/polysilicon 1024/second charge storage dielectric material 1026/second top oxide 1200.

Figure 13:
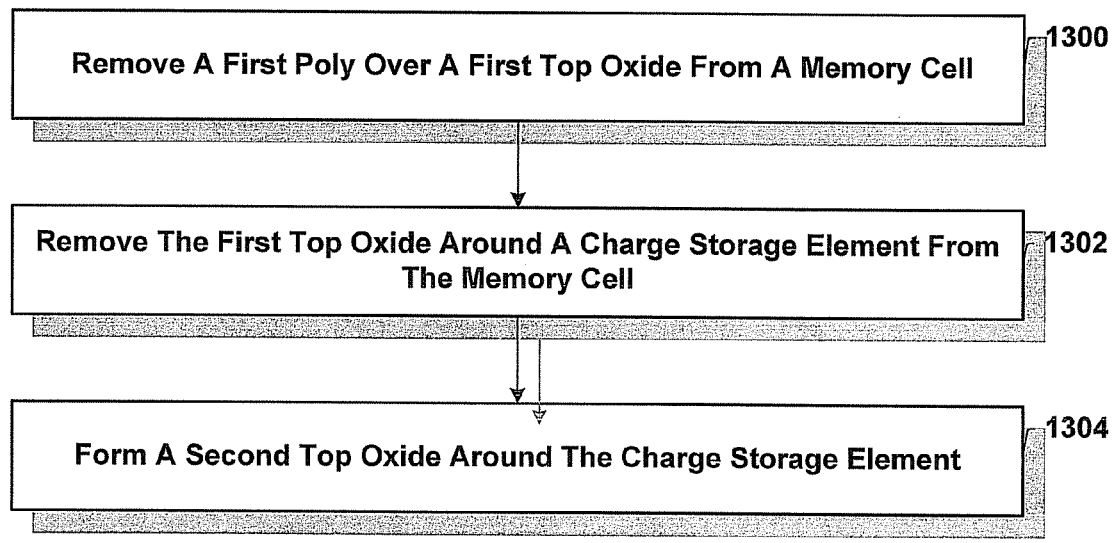
FIG. 13 illustrates an exemplary methodology of replacing/reforming a top oxide around a charge storage element of a memory cell and/or improving quality of a top oxide around a charge storage element of a memory cell in accordance with an aspect of the subject invention.

FIG. 13 illustrates an exemplary methodology of replacing/reforming a top oxide around a charge storage element of a memory cell and/or improving quality of a top oxide around a charge storage element of a memory cell. At 1300, a first poly over a first top oxide is removed from the memory cell. At 1302, the first top oxide around a charge storage element is removed from the memory cell. At 1304, a second top oxide is formed around the charge storage element. In one embodiment, the second top oxide is formed by a low temperature oxidation process, such as a slot plane antenna process. In another embodiment, the second top oxide is formed by oxidizing a portion of the charge storage element, for example, an upper portion of the charge storage element. In yet another embodiment, the second top oxide is formed by forming a sacrificial layer over the memory cell and converting the sacrificial layer to an oxide layer. The sacrificial layer can be converted to the oxide layer by, for example, a slot plane antenna process. In one embodiment, the sacrificial layer contains nitrides, oxides, or combinations thereof (e.g., silicon nitrides, silicon oxynitrides, silicon rich silicon nitrides, or combinations thereof). Although not shown in the Figure, the method can further include forming a second poly and/or a word line over the second top oxide.

Although not shown, the methodology of FIG. 13 may include any suitable semiconductor structure fabrication processes. General examples of semiconductor structure fabrication processes include masking, patterning, etching, cleaning, planarization, thermal oxidation, implant, annealing, thermal treatment, and deposition techniques normally used for making semiconductor structures.

The resultant memory devices formed herein can be any suitable memory devices. Examples of memory devices include volatile memories and non-volatile memories. Examples of volatile memories include RAM such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), Rambus dynamic RAM (RDRAM), and the like. Examples of non-volatile memories include ROM, PROM, electrically programmable ROM (EPROM), electrically erasable programmable ROM (EEPROM), flash memory, and the like. The memory device also can be employed for central processing units (CPUs), input/output devices (I/O chips), and the like.

The resultant memory devices formed herein are useful in any electronic device. For example, the resultant memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices can achieve improvements in portability due to the quality, small size, lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "contain," "includes," and "involves" are used in either the detailed description or the claims, such terms are intended to be inclusive in a manner similar to the term "comprising" as "comprising" is interpreted when employed as a transitional word in a claim.

What is claimed is:

1. A method of replacing a first top oxide over charge storage elements of a memory cell, comprising:
    providing a memory cell on a semiconductor substrate and between bit line dielectrics, the memory cell comprising a charge storage layer over the semiconductor substrate and a first poly over the charge storage layer, the charge storage layer comprising two charge storage elements separated by a central dielectric, a first charge storage dielectric material adjacent to and below the charge storage elements, a second charge storage dielectric material adjacent to and above the charge storage elements, and the first to oxide adjacent to and above the second charge storage dielectric material;
    removing the entire first poly to expose the first top oxide and the central dielectric;
    removing the entire first top oxide to expose the second charge storage dielectric material;
    removing an upper portion of the central dielectric and at least a portion of the central dielectric touching side surfaces of the charge storage elements; and
    forming a second top oxide on the second charge storage dielectric material.

2. The method of claim 1, wherein the forming the second top oxide comprises oxidizing a portion of the second charge storage dielectric material.

3. The method of claim 1, wherein the forming the second top oxide comprises forming a sacrificial layer over the second charge storage dielectric material and converting the sacrificial layer to an oxide layer.

4. The method of claim 3, wherein the converting the sacrificial layer to the oxide layer comprises a slot plane antenna process.

5. The method of claim 1, wherein the second top oxide is formed over a remaining portion of the central dielectric, and the side surfaces of the charge storage elements.

6. The method of claim 1, further comprising forming a second poly over the second top oxide.

7. A method of replacing a first top oxide over charge storage elements of a memory cell, comprising:
    providing a memory cell on a semiconductor substrate and between bit line dielectrics, the memory cell comprising a charge storage layer over the semiconductor substrate and a first poly over the charge storage layer, the charge storage layer comprising two charge storage elements separated by a central dielectric, a first charge storage dielectric material adjacent to and below the charge storage elements, a second charge storage dielectric material adjacent to and above the charge storage elements, and the first to oxide adjacent to and above the second charge storage dielectric material;
    removing the entire first poly to expose the first top oxide and the central dielectric;
    removing the entire first top oxide to expose the second charge storage dielectric material;
    removing an upper portion of the central dielectric and at least a portion of the central dielectric touching side surfaces of the charge storage elements; and
    oxidizing a portion of the second charge storage dielectric material to form a second top oxide on the second charge storage dielectric material, wherein the second charge storage dielectric material comprises nitride.

8. The method of claim 7, wherein the oxidizing the portion of the second charge storage dielectric material comprises a slot plane antenna process.

9. A method of replacing a first top oxide over charge storage elements of a memory cell, comprising:
    providing a memory cell on a semiconductor substrate and between bit line dielectrics, the memory cell comprising a charge storage layer over the semiconductor substrate and a first poly over the charge storage layer, the charge storage layer comprising two charge storage elements separated by a central dielectric, a first charge storage dielectric material adjacent to and below the charge storage elements, a second charge storage dielectric material adjacent to and above the charge storage elements, and the first to oxide adjacent to and above the second charge storage dielectric material;
    removing the entire first poly to expose the first top oxide and the central dielectric;
    removing the entire first top oxide to expose the second charge storage dielectric material;
    removing an upper portion of the central dielectric and at least a portion of the central dielectric touching side surfaces of the charge storage elements; and
    forming a sacrificial layer over the second charge storage dielectric material; and
    oxidizing the sacrificial layer to form a second top oxide layer on the second charge storage dielectric material.

10. The method of claim 9, wherein the oxidizing the sacrificial layer to form the second top oxide comprises a low temperature oxidation process.

11. The method of claim 9, the oxidizing the sacrificial layer to form the second top oxide comprises a slot plane antenna process.

12. The method of claim 9, wherein the sacrificial layer comprises silicon nitride, oxide, or combinations thereof.

13. The method of claim 2, wherein the second charge storage dielectric material comprises siicon rich silicon nitride.

14. The method of claim 2 wherein the oxidizing the second charge storage dielectric material comprises oxidizing the second charge storage dielectric material at about 240 degrees Celsius or more and about 500 degrees Celsius or less.

15. The method of claim 3, wherein the converting the sacrificial layer to the oxide layer comprises oxidizing the sacrificial layer at about 240 degrees Celsius or more and about 500 degrees Celsius or less.

16. The method of claim 1, wherein the forming the second top oxide comprises growing the second top oxide in plasma at low temperatures.

17. The method of claim 2, wherein each of the charge storage elements become thinner in response to the oxidizing the portion of the second charge storage dielectric material.

18. The method of claim 7, wherein each of the charge storage elements become thinner in response to the oxidizing the portion of the second charge storage dielectric material.

19. The method of claim 7, wherein the oxidizing the portion of the second charge storage dielectric material comprises a low temperature oxidation process.

20. The method of claim 7, wherein the oxidizing the portion of the second charge storage dielectric material is performed at a temperature of about 240 degrees Celsius or more and about 500 degrees Celsius or less.

* * * * *